United States Patent [19]

Morita et al.

[11] Patent Number: 4,763,405
[45] Date of Patent: Aug. 16, 1988

[54] CHIP-PLACEMENT MACHINE WITH TEST FUNCTION

[75] Inventors: Koichi Morita; Susumu Takaichi; Muneyoshi Fujiwara; Makito Seno; Yoshihiko Misawa, all of Osaka, Japan

[73] Assignee: Matsushita Electric Industrial Co., Ltd., Osaka, Japan

[21] Appl. No.: 85,819

[22] Filed: Aug. 17, 1987

[30] Foreign Application Priority Data

Aug. 21, 1986 [JP] Japan .............................. 61-196165
Nov. 20, 1986 [JP] Japan .............................. 61-277264

[51] Int. Cl.[4] ........................................... B23P 19/04
[52] U.S. Cl. ...................................... 29/740; 29/593; 29/759
[58] Field of Search ................. 29/740, 739, 741, 714, 29/759, 593, 832, 834; 324/158 F; 209/573, 574

[56] References Cited

U.S. PATENT DOCUMENTS

| 4,286,380 | 9/1981 | Blount | 29/741 |
| 4,327,482 | 5/1982 | Araki et al. | 29/740 |
| 4,458,412 | 7/1984 | Dean et al. | 29/705 |
| 4,557,043 | 12/1985 | Starski | 29/741 |
| 4,593,820 | 6/1986 | Antonie et al. | 324/158 F |
| 4,627,157 | 12/1986 | Campisl et al. | 29/741 |

Primary Examiner—P. W. Echols
Attorney, Agent, or Firm—Pollock, VandeSande & Priddy

[57] ABSTRACT

In an electronic chip placement machine with test function, there is provided a suction nozzle for holding a chip, a chip-regulation device for regulating the attitude of the chip by clamping the chip at portions having no electrodes probes for testing electrical characteristics of the chip. The tip portion of the suction nozzle is made of an insulating material such as a ceramic or a synthetic resin in order to avoid a short-circuit between electrodes of the chip through the nozzle. Therefore, the electrical characteristics of the chip can be tested without the separation between the nozzle and the chip. Furthermore, since one cycle of the operational process according to the present invention is shorter than that of the conventional operational process, it is possible to provide chip-test and placement machines whose structure is simple. As a result, productivity and durability can also be increased.

7 Claims, 6 Drawing Sheets

CHIP-PLACEMENT MACHINE WITH TEST FUNCTION

BACKGROUND OF THE INVENTION

1. Field of the Invention

This invention relates to a machine for supplying and placing electronic chips such as resistors, capacitors, coils, diodes and transistors, and more particularly to a machine for placing the electronic chips and test resistance, capacitance, or polarity thereof.

2. Description of the Prior Art

Heretofore, when testing leadless electronic chips immediately before placing the electronic chips at a selected position on a printed circuit (P.C.) board, a particular process for testing the chips is required. Namely, a chip-placement machine of the prior art is required to have a special process in which, for instance, the chip in question is shifted by using another driving means to a check position with the chip being held by a suction nozzle, and the chip is shifted back to a placement position after testing. Therefore, there are the drawbacks that the structure of the machine is complicated and that the manufacturing cost is high.

Moreover, in the case of testing a small electronic chip, both electrodes of the chip 1 are short-circuited through the portions 3 of a suction nozzle 2 which is made of a conductive metal as shown in FIG. 6. Therefore, it is required that the suction nozzle 2 has to be separated from the chip 1 when testing the same. Accordingly, as shown in FIGS. 7A to 7G, an operational process of the suction nozzle 2 and a pair of probes 20a, 20b for testing are operated as follows: descent of the nozzle (7B), application of the probes (7C), ascent of the nozzle and test (7D), descent of the nozzle and suction (7E), withdrawal of the probes (7F), and ascent of the nozzle (7G). Thus, one cycle of the operational process required a long period of time so that there is a further disadvantage that productivity is decreased when the testing function is incorporated into the placement machine.

SUMMARY OF THE INVENTION

The present invention has been developed in order to remove the above-described drawbacks inherent to conventional chip placement machines.

It is an object of the present invention to provide a chip placement machine which has a test function for an electronic chip without separation between a suction nozzle and the electronic chip when testing the same.

It is another object of the invention to provide a chip test and placement machine which provides no short-circuit of the chip when testing the same.

The above objects can be achieved, according to the invention, by an electronic chip placement machine with test function, comprising: a suction nozzle whose tip end portion is made of an insulating material such as a ceramic or a synthetic resin; means for regulating a chip by clamping the chip at portions having no electrodes; means for testing electrical characteristics of the chip, including two pairs of probes for clamping the chip and for applying voltage thereto.

BRIEF DESCRIPTION OF THE DRAWINGS

The object and features of the present invention will become more readily apparent from the following detailed description of the preferred embodiment taken in conjunction with the accompanying drawings in which.

The same or corresponding elements and parts are designated at like reference numerals throughout the drawings.

DETAILED DESCRIPTION OF THE INVENTION

Figure 1:
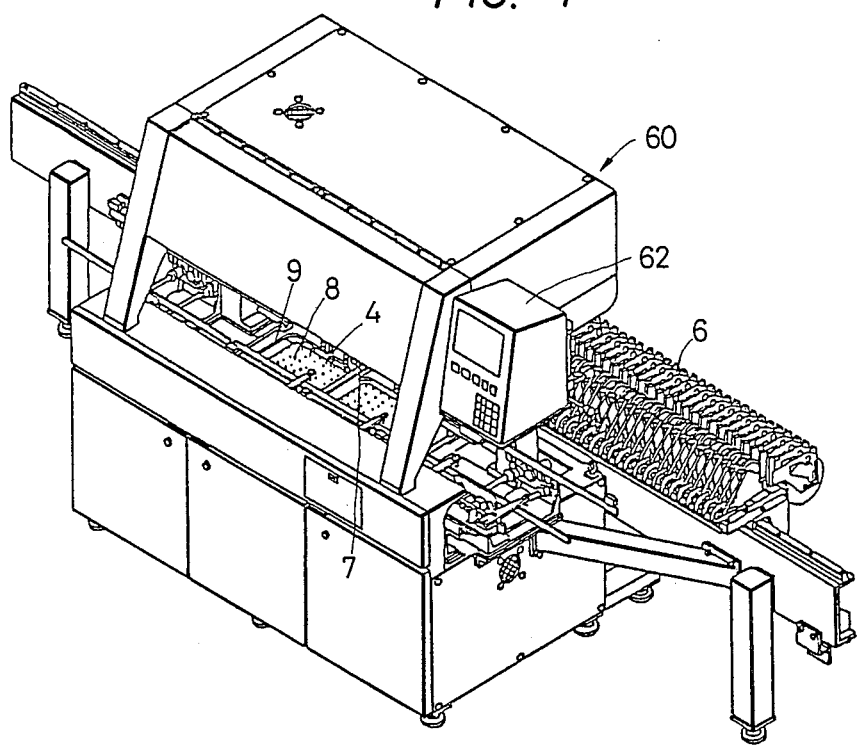
FIG. 1 is a perspective view of a chip placement machine with test function according to one embodiment of the present invention.
Figure 2:
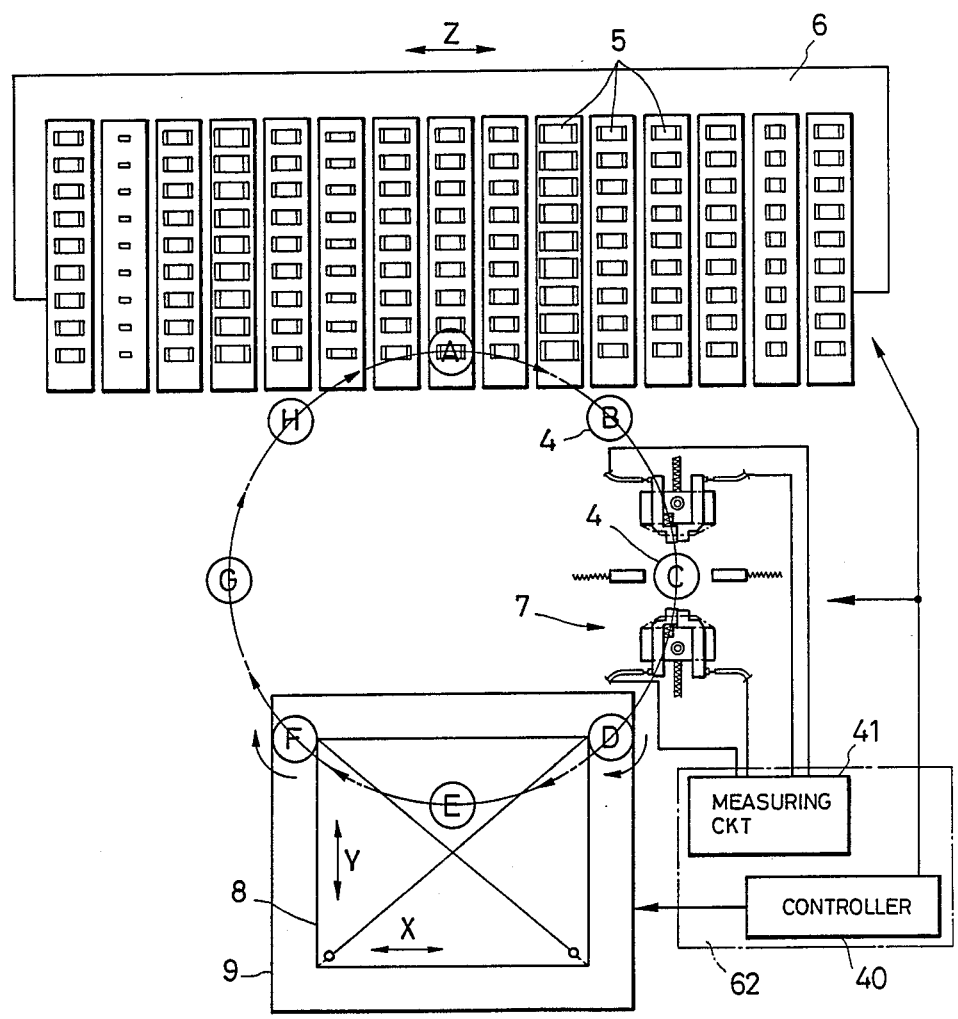
FIG. 2 is a schematic view showing operations of a chip placement machine according to the embodiment of the present invention.

FIG. 1 is a perspective view of a chip placement machine 60 with test function according to one embodiment of the present invention. Numeral 4 denotes a suction nozzle for holding a chip by using a vacuum, and this nozzle can be shifted along a predetermined locus. Numeral 6 is a chip supply portion, and numeral 7 denotes a chip-regulation device for regulating the chip. Numeral 8 denotes a P.C. board on which chips will be placed after the chips are brought from the chip supply portion 6. Numeral 9 denotes an X-Y table carrying the P.C. board 8. This X-Y table has means for arbitrarily adjusting the position of the P.C. board in the direction of references X and Y as shown in FIG. 2, so that a chip will be placed at a desired position. The chip placement machine 60 comprises a control unit 62 which controls various operating portions of the machine as will be described in detail hereinafter.

Figure 3:
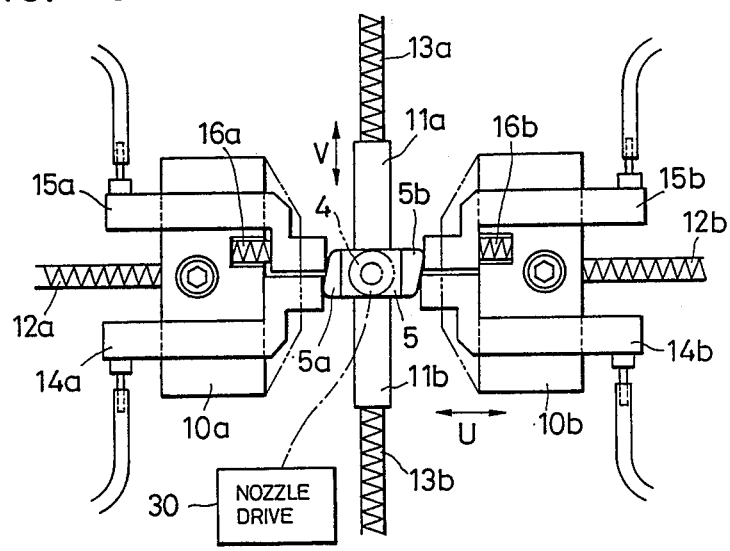
FIG. 3 is an enlarged top plan view of a chip-regulation device in a chip placement machine according to the embodiment of the present invention.

FIG. 2 is a schematic view showing the operations of the chip placement machine according to the embodiment of the present invention. Electronic chips 5 are arranged and set on the chip supply portion 6 having means for arbitrarily shifting in the direction of Z. One of the chips 5 is held by the suction nozzle 4 at a holding or suction position A. This chip held at the tip of the suction nozzle is shifted along a circle including positions A-B-C- . . . -H-A by a nozzle driving means 30 as shown in FIG. 3. The chip-regulation device 7 is provided at the test position C, so that the regulation of the attitude of the chip 5 and a test of the electrical characteristics of the chip 5 are performed at this position C. Then, the chip 5 is placed on the P.C. board at the position E with the X-Y table carrying the P.C. board being shifted to a desired position. If the chip 5 is determined to be unacceptable as a result of testing, the chip 5 held by the suction nozzle 4 is shifted to an ejecting position G for ejecting the chip without placing it on the P.C. board. In order that each chip is held by the suction nozzle 4, attitude-regulated, tested, and placed or ejected to form one cycle of operation, the above-mentioned various driving or shifting mechanisms are controlled by a controller 40 which is installed in the control unit 62.

FIG. 3 is an enlarged top plan view of the chip regulation device 7 in the chip placement machine according to the embodiment of the present invention. Two pairs of slidable blocks 10a, 10b and 11a, 11b are provided so as to respectively freely slide in the directions of U and V which are perpendicular to each other. The slidable blocks 10a and 10b are respectively pressed by compression springs 12a and 12b, and the slidable blocks 11a and 11b are respectively pressed by compression springs 13a and 13b in the direction of the chip 5. The slidable blocks 10a, 10b, 11a, 11b and the nozzle 4 are made of an insulating material. The slidable block 10a comprises a fixed probe 14a and a slidable probe 15a which is biased by a compression spring 16a in the direction of the chip 5. The slidable block 10b comprises a fixed probe 14b and a slidable probe 15b which is biased by a compression spring 16b in the direction of the chip 5. The probes 14a and 15a respectively face the probes 14b and 15b as shown in FIG. 3. Therefore, a distance between the slidable probes 15a and 15b is shorter than a distance between the fixed probes 14a and 14b when the chip 5 is not clamped.

Figure 4A:
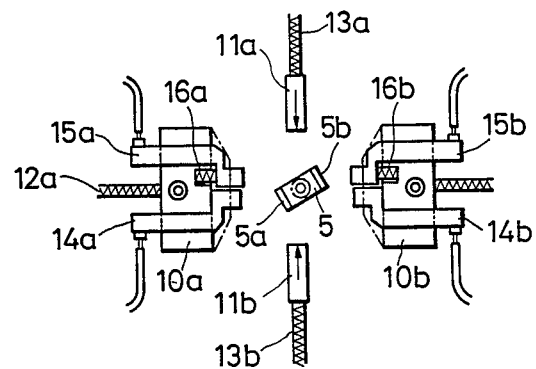
FIGS. 4A–4C are top plan views showing operations of a chip-regulation device in a chip placement machine according to the embodiment of the present invention.
Figure 4B:
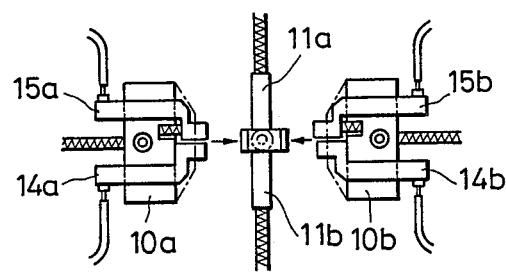
Figure 4C:
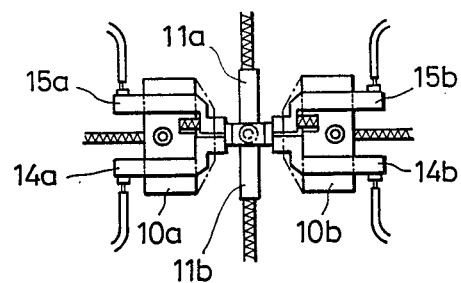

FIGS. 4A-4C illustrate how the attitude of the chip 5 is regulated for testing the same. In FIG. 4A, the two pairs of the slidable blocks 10a, 10b and 11a, 11b are moved apart from each other and locked to wait for the chip 5 carried by the nozzle 4. After the chip 5 is positioned at a predetermined position, the chip 5 is clamped at portions having no electrodes 5a and 5b by the pair of slidable blocks 11a, 11b so that the attitude of the chip 5 is regulated as shown in FIG. 4B. Then, the electrodes 5a and 5b of the chip 5 are clamped by the probes 14a, 14b, 15a, 15b of the pair of slidable blocks 10a, 10b which have been released from the locked state thereof as shown in FIG. 4C. At this time, the electrical characteristics of the chip 5 are tested by a measuring circuit 41 included in the control unit 62 of FIG. 1. After the chip 5 is tested, the two pairs of slidable blocks 10a, 10b, and 11a, 11b are moved apart from each other again as shown in FIG. 4A.

Turning back to FIG. 3, the tip end of the slidable probes 15a, 15b are respectively protruded by the force of the compression springs 16a, 16b relative to the fixed probe 14a, 14b, so that the chip 5 can securely be clamped by supporting four points thereof even if the configuration of the electrodes 5a and 5b is irregular.

Generally, in the case that a chip is tested using four probes, an error caused by a contact resistance between each electrode and each probe is smaller than that resulted when the chip is tested using only two probes. According to the above-described preferred embodiment of the present invention, the chip 5 can be tested using four probes. More specifically, a Kelvin bridge can be formed if one pair of the probes is used for applying current to first and second electrodes and the other pair of the probes is used for detecting a voltage across third and fourth electrodes. As a result, it is possible to test not only low impedance chips but also high impedance chips with high precision.

Figure 5:
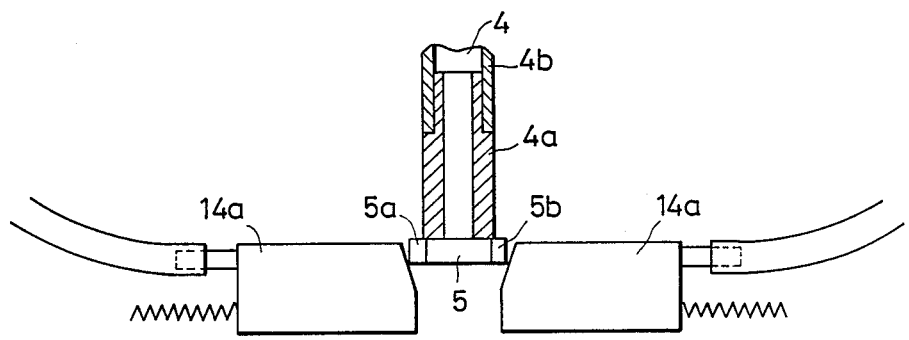
FIG. 5 is a cross sectional view of a chip-regulating device and a suction nozzle in a chip placement machine according to the embodiment of the present invention.
Figure 6:
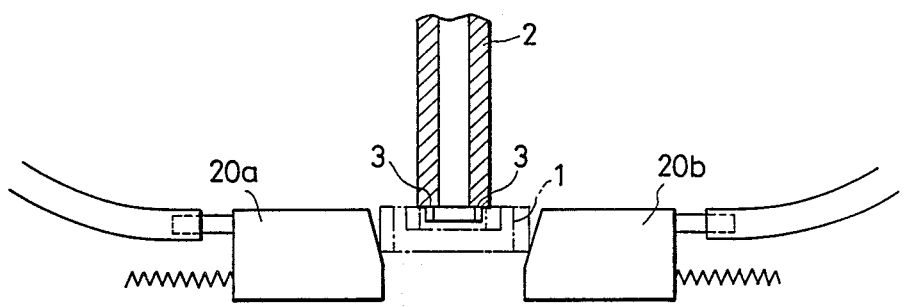
FIG. 6 is a cross sectional view of a chip-regulation device and a suction nozzle in a conventional chip-placement machine.
Figure 7A:
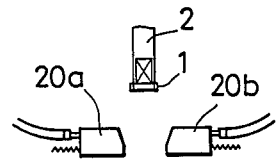
FIGS. 7A–7G show operational processes for testing electrical characteristics of an electronic chip according to the prior art.
Figure 7B:
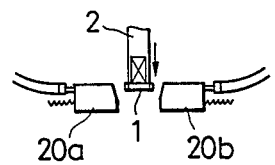
Figure 7C:
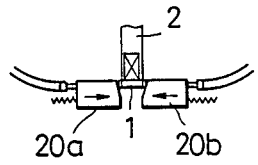
Figure 7D:
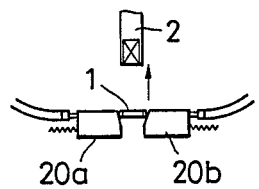
Figure 7E:
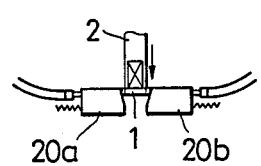
Figure 7F:
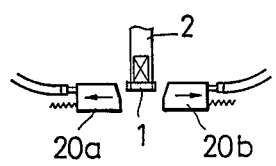
Figure 7G:
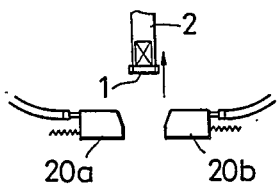
Figure 8A:
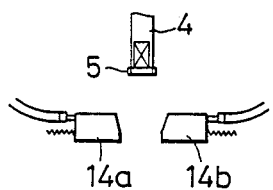
FIGS. 8A–8E show operational processes for testing electrical characteristics of an electronic chip according to the embodiment of the present invention.
Figure 8B:
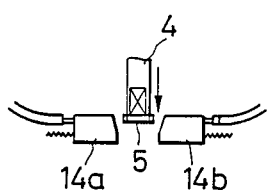
Figure 8C:
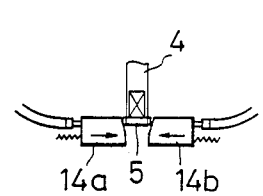
Figure 8D:
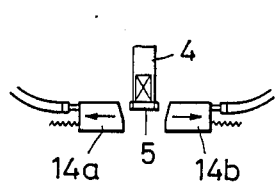
Figure 8E:
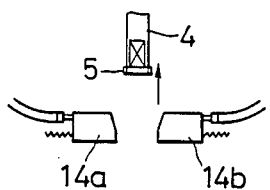

FIG. 5 is a cross-sectional view of the chip-regulation device 7 and the suction nozzle 4 in the chip placement machine according to the embodiment of the present invention. The chip 5 being held by the suction nozzle 4 is clamped by the probes 14a, 14b, 15a, and 15b for the testing of the electrical characteristics thereof. A tip end portion 4a of the nozzle 4 is made of an insulating material, and is fixed to a shank portion 4b. Therefore, the electrodes 5a and 5b are never short-circuited via the suction nozzle 4 when testing the electrical characteristics of the chip 5. As a result, it is unnecessary that the suction nozzle 4 be separated from the chip 5 during testing.

As will be seen from the above results, only the operations, i.e. descent of the nozzle, application of the probes and chip test, withdrawal of the probes, and ascent of the nozzle, are required as shown in FIGS. 8A-8E exhibiting operational processes according to the embodiment of the present invention. Thus, one cycle of the operational process according to the present invention is shorter than that of the conventional operational process shown in FIGS. 7A-7G because the electrical characteristics of the chip 5 can be tested without the separation between the nozzle 4 and the chip 5. As a result, it is possible to provide chip test and placement machines whose structure is simple, so that productivity and durability can also be increased.

In this embodiment of the present invention, although the tip end of the nozzle 4 is made of an insulating material, a metallic nozzle being coated with a ceramic or with a synthetic resin having desired durability and strength may also be applied.

It will thus be seen that the objects made apparent from the preceding description are efficiently attained and, since certain changes may be made in the above construction without departing from the spirit and scope of the invention, it is intended that all matters contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. An electronic chip placement machine with test function, comprising:
    (a) first means for forwarding an electronic chip to a holding position;
    (b) suction means for holding an electronic chip using vacuum, said suction means including a suction nozzle arranged to be reciprocally moved, a tip of said suction nozzle being nonconductive;
    (c) driving means for shifting said suction nozzle so that said suction nozzle is placed at positions including said holding position, a test position, a placement position, and an ejecting position;
    (d) second means for clamping and ejecting said chip, said second means having,
        (i) a first pair of clamping members for clamping said chip at portions having no electrode thereby regulating the attitude of said chip, and
        (ii) a second pair of clamping members for clamping said chip at said electrodes, said second pair of clamping members having probes for establishing electrical connection with said electrodes;
    (e) third means connected to said probes for testing electrical characteristics of said chip and for determining whether a tested chip is acceptable or not at said test position;

(f) fourth means for shifting a member on which said chip is to be placed so that said chip is placed at a desired position on said member when said chip is at said placement position; and (g) fifth means for controlling said driving means and said first to fourth means so that said chip is placed at a given position on said member or ejected after testing.

2. An electronic chip placement machine with test function as claimed in claim 1, wherein said tip of said suction nozzle is made of a ceramic.

3. An electronic chip placement machine with test function as claimed in claim 1, wherein said tip of said suction nozzle is made of a synthetic resin.

4. An electronic chip placement machine with test function as claimed in claim 1, wherein said tip of said suction nozzle is coated with a ceramic.

5. An electronic chip placement machine with test function as claimed in claim 1, wherein said second pair of clamping members comprise first and second blocks made of an insulating material, a first pair of probes and a second pair of probes.

6. An electronic chip placement machine with test function as claimed in claim 5, wherein one of said two probes carried by each of said first and second blocks is slidably movable and the other of said two probes is fixed to said block.

7. An electronic chip placement machine with test function as claimed in claim 5, wherein a distance between said first pair of probes is shorter than that of said second pair of probes.

* * * * *